US006849871B2

(12) United States Patent
Ning (10) Patent No.: US 6,849,871 B2
(45) Date of Patent: Feb. 1, 2005

(54) FULLY-DEPLETED-COLLECTOR SILICON-ON-INSULATOR (SOI) BIPOLAR TRANSISTOR USEFUL ALONE OR IN SOI BICMOS

(75) Inventor: Tak Hung Ning, Yorktown Heights, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 09/757,965

(22) Filed: Jan. 10, 2001

(65) Prior Publication Data

US 2002/0089038 A1 Jul. 11, 2002

Related U.S. Application Data

(60) Provisional application No. 60/242,339, filed on Oct. 20, 2000.

(51) Int. Cl.[7] .................................................. H01L 29/40
(52) U.S. Cl. ...................... 257/47; 257/197; 257/205; 257/273; 257/361; 257/370; 257/378; 257/477
(58) Field of Search ........................ 257/47, 197, 205, 257/273, 347, 350, 361, 370, 378, 477, 511, 517–518, 525–526, 539, 552–555, 565; 438/149, 479, 517

(56) References Cited

U.S. PATENT DOCUMENTS 5,506,427 A * 4/1996 Imai ............................ 257/197
5,587,599 A * 12/1996 Mahnkopf et al. .......... 257/370

OTHER PUBLICATIONS

Y. Taur and T.H. Ning, Fundamentals of Modern VLSI Devices, Chapter 6, Bipolar Devices, Cambridge University Press, 1998, pp. 292–347.
T. Hiramoto et al., IEDM Tech. Digest, pp. 39–42, 1992.
K. Washio et al., IEDM, p. 741, 2000.

* cited by examiner

Primary Examiner—Thien F Tran
(74) Attorney, Agent, or Firm—Scully, Scott, Murphy & Presser; Robert M. Trepp, Esq.

(57) ABSTRACT

A bipolar transistor structure is described incorporating an emitter, base, and collector having a fully depleted region on an insulator of a Silicon-On-Insulator (SOI) substrate without the need for a highly doped subcollector to permit the fabrication of vertical bipolar transistors on semiconductor material having a thickness of 300 nm or less and to permit the fabrication of SOI BiCMOS. The invention overcomes the problem of requiring a thick semiconductor layer in SOI to fabricate vertical bipolar transistors with low collector resistance.

3 Claims, 14 Drawing Sheets

Prior Art

Fig.1

Prior Art

FULLY-DEPLETED-COLLECTOR SILICON-ON-INSULATOR (SOI) BIPOLAR TRANSISTOR USEFUL ALONE OR IN SOI BiCMOS

This appl. claims the benefit of Provisional Appl. No. 60/242,339, filed Oct. 20, 2000.

FIELD OF THE INVENTION

This invention relates to bipolar transistors and more particularly to a bipolar transistor structure suitable for implementation on silicon on insulator (SOI) alone or with Complementary Metal Oxide Semiconductor (CMOS) devices to provide SOI BiCMOS essential for most RF and communication products or digital products that have some critical analog components.

BACKGROUND OF THE INVENTION

High-performance bipolar transistors are vertical bipolar transistors, as opposed to lateral bipolar transistors. A vertical bipolar transistor, for example an npn bipolar transistor 2 schematically shown in FIG. 1, comprises an n+ type emitter region 3, a p type base region 4, and an n type collector region 5 stacked one on top of the other. In order to reduce collector series resistance, there is usually an n+ type subcollector layer 6 beneath the collector region 5 and an n+ type reachthrough region 7 is used to bring the collector contact to the surface.

In normal operation, the emitter-base diode is forward biased, and the base-collector diode is reverse biased. The entire n type collector layer is usually thick enough to accommodate the space-charge region (also called the depletion region since it is normally depleted of mobile carriers) and a quasi-neutral region. The thickness, or width, of the space-charge region is determined by the collector doping concentration and the base-collector bias voltage. The quasi-neutral collector region can be very thin, usually just thick enough to prevent the space-charge region from reaching the n+ type subcollector layer. If the base-collector space-charge region touches the n+ type subcollector, it will cause the base-collector junction capacitance to increase and the base-collector junction breakdown voltage to decrease. The n+ type subcollector layer is usually rather thick, typically thicker than 1000 nm, in order to achieve an adequately small collector series resistance.

Figure 2:
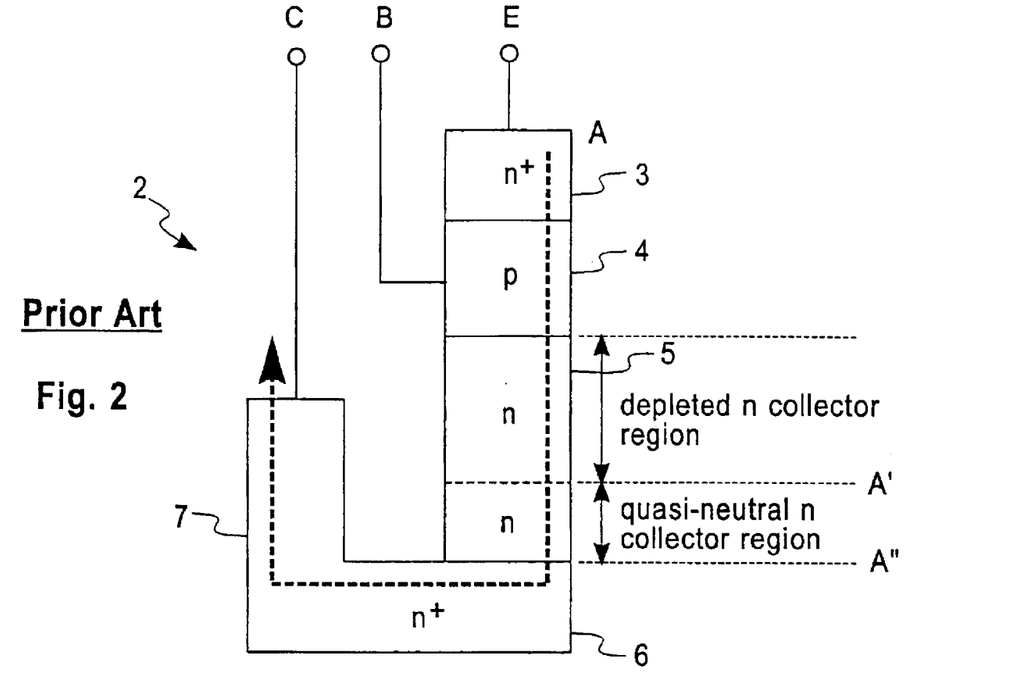
FIG. 2 is a cross section schematic view of a vertical bipolar transistor of the prior art with the electron path shown through the transistor.
Figure 3:
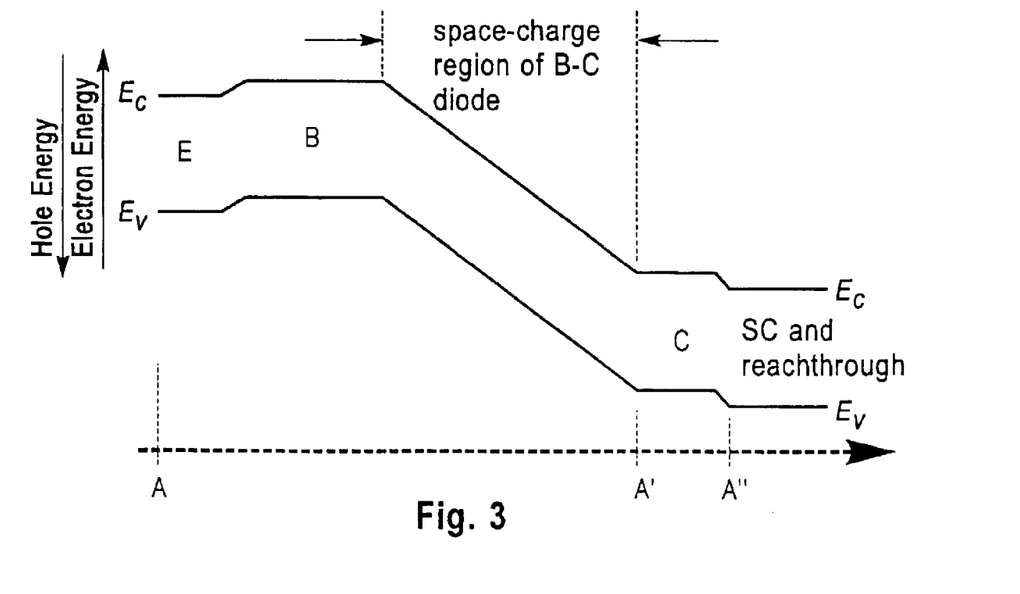
FIG. 3 is a graph of the energy-band diagram along the electron current path shown in FIG. 2.

In normal operation, electrons are injected from the emitter E and collected at the collector C. The dotted arrow shown in FIG. 2 indicates the electron path in normal operation, starting from the emitter contact. FIG. 3 is the energy-band diagram along the electron path. In FIGS. 2 and 3, A indicates the location of the emitter contact, A' indicates the boundary between the depleted part and the quasi-neutral part of the n type collector, and A" indicates the top of the n+ subcollector layer. In FIG. 3, the ordinate represents electron and hole energy.

A more detailed description of the basic structure and operation of a bipolar transistor can be found in the book by Yuan Taur and Tak H. Ning entitled Fundamentals of Modern VLSI Devices, Chapter 6, Bipolar Devices, Cambridge University Press, 1998, pp 292–347 which is incorporated herein by reference.

Figure 4:
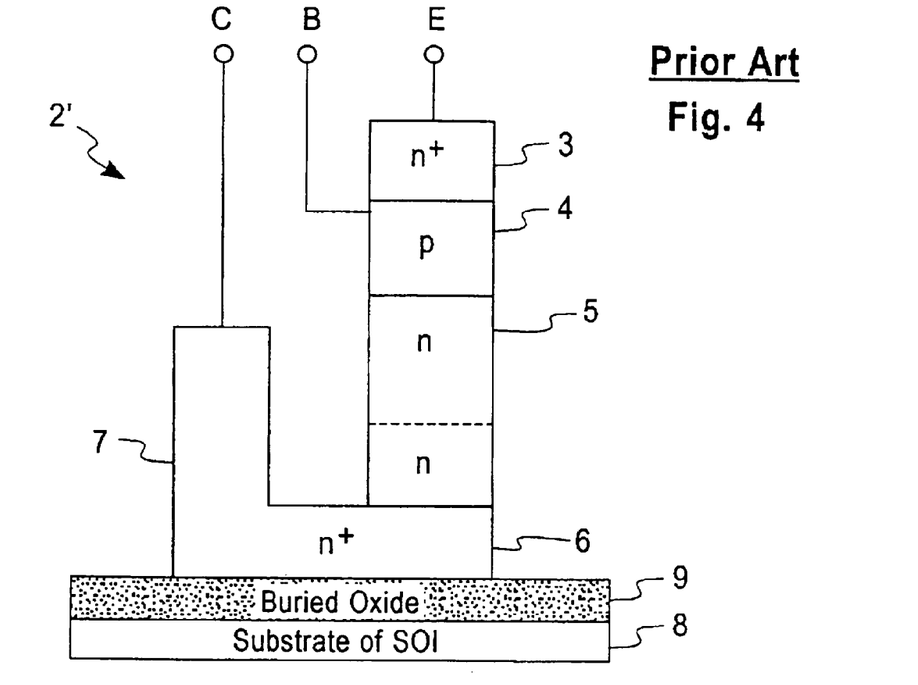
FIG. 4 is a cross section schematic view of a vertical npn bipolar transistor using SOI of the prior art.

Vertical bipolar transistors have been built in the silicon layer of SOI. FIG. 4 illustrates a vertical npn bipolar transistor 2' using SOI. Usually, it is simply a vertical bipolar transistor, including its n+ type subcollector layer 6, sitting on a buried oxide layer 9 and substrate 8 of the SOI. The SOI silicon layer has to be rather thick, thick enough to accommodate the various layers of a vertical bipolar transistor described above.

SOI BiCMOS obtained from the integration of a vertical bipolar transistor with CMOS devices using SOI has been described in a publication by Toshiro Hiramoto, et al., "A 27 GHz double polysilicon bipolar technology on bonded SOI with embedded 58 $\mu m^2$ CMOS memory cells for ECL-CMOS SRAM applications," IEDM Technical Digest, pp. 39–42, 1992.

The thick silicon layer needed for the bipolar transistor results in the CMOS devices behaving like regular bulk CMOS devices, rather than like high-speed SOI CMOS devices. The silicon layer of high-speed SOI CMOS is usually rather thin, typically less than 200 nm, much too thin to accommodate present vertical bipolar transistor structures.

Figure 5:
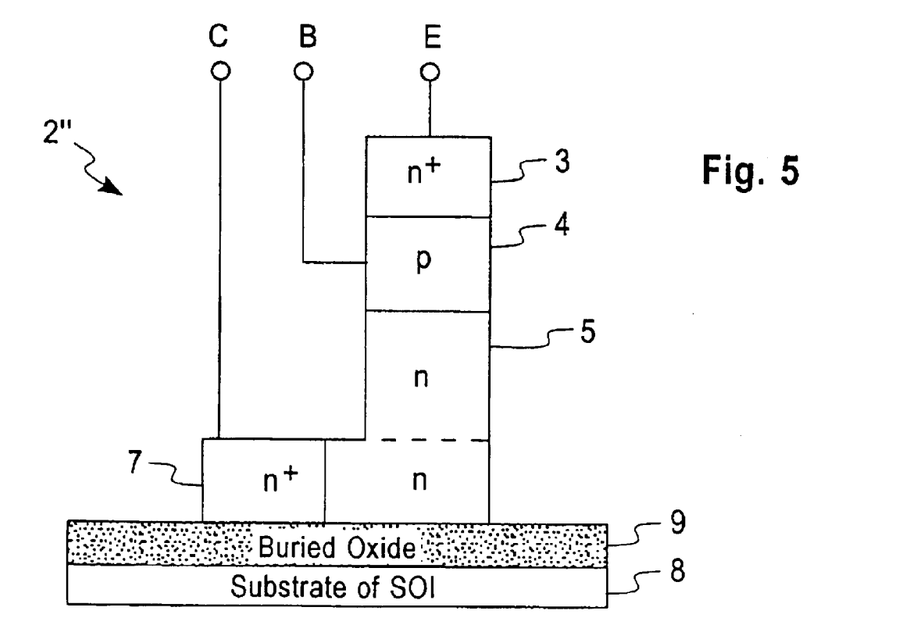
FIG. 5 is a cross section schematic view of an alternate vertical npn bipolar transistor structure on SOI illustrating deficiencies due to the high series resistance through the collector.

It is possible to significantly reduce the silicon thickness needed for making SOI vertical bipolar transistors 2" by omitting the relatively thick n+ subcollector layer 6. This structure is illustrated in FIG. 5. The electrons still flows the same way as in a vertical bipolar transistor with a subcollector layer, namely vertically through the base layer and through the depletion layer of the base-collector diode to the quasi-neutral collector region. However, without the n+ subcollector layer 6, electron current will have to be carried by the quasi-neutral collector layer which has very high sheet resistance because of its relatively light doping concentration and relatively small thickness compared to the n+ type subcollector layer 6. The resulting collector series resistance is unacceptably large. If the n type collector thickness is increased significantly to reduce collector series resistance, the resultant SOI silicon layer will again be much to thick for integration with high-speed SOI CMOS devices.

SUMMARY OF THE INVENTION

In accordance with the present invention, a bipolar transistor on SOI is described comprising a substrate, an insulating layer over the substrate, a first single crystal semiconductor layer positioned over the insulating layer having a lightly doped region of a first type and at least one contiguous heavily doped region of the first type, the lightly doped region and the contiguous heavily doped region functioning as a collector, a second patterned semiconductor layer of a second type formed over the lightly doped region of the first semiconductor layer to function as the base, and a third patterned semiconductor layer of the first type positioned over the second semiconductor layer to function as the emitter, the lightly doped region of the first type of the collector having a dopant concentration to fully deplete of mobile charge through the first semiconductor layer to the insulating layer of the SOI below.

The invention further provides an integrated circuit chip having both npn and pnp bipolar transistors of the above structure on SOI.

The invention further provides an integrated circuit chip having one or both npn and pnp bipolar transistors of the above structure on SOI and p-channel MOSFETs and n-channel MOSFETs wherein the source and drain regions of the MOSFETs extend downward to the insulating layer of the SOI.

The invention further provides a bipolar transistor on SOI comprising a substrate, an insulating layer over the substrate, a first single crystal semiconductor layer positioned over the insulating layer having a lightly doped region of a first type and at least one contiguous heavily doped region of the first type, the lightly doped region and the contiguous heavily doped region functioning as a collector, a top region of the lightly doped region is counter-doped to a second type to function as the base, a second patterned semiconductor layer of the second type formed over a region of the counter-doped region of the first semiconductor layer to function as the extrinsic base, and a third patterned semiconductor layer of the first type positioned over the counter-doped region of the first semiconductor layer to function as the emitter, the lightly doped region of the first type in the first semiconductor layer having a dopant concentration to fully deplete of mobile charge through the first semiconductor layer to the insulating layer of the SOI below.

The invention further provides an integrated circuit chip having both npn and pnp bipolar transistors of the above structure on SOI.

The invention further provides an integrated circuit chip having one or both npn and pnp bipolar transistors of the above structure on SOI and p-channel MOSFETs and n-channel MOSFETs wherein the source and drain regions of the MOSFETs extend downward to the insulating layer of the SOI.

The invention provides a fully-depleted-collector SOI vertical bipolar transistor which has a much smaller base-collector junction capacitance than conventional devices and does not require a heavily doped subcollector layer.

The invention provides an SOI bipolar transistor structure which uses thin-silicon SOI typically less than 200 nm, and is therefore readily compatible with high-speed SOI CMOS devices also using thin-silicon SOI for making high-speed SOI BiCMOS.

BRIEF DESCRIPTION OF THE DRAWING

These and other features, objects, and advantages of the present invention will become apparent upon consideration of the following detailed description of the invention when read in conjunction with the drawing in which:

FIG. 18 is a cross section view along the lines 18—18 of FIG. 19.

DESCRIPTION OF THE PREFERRED EMBODIMENTS

Figure 6:
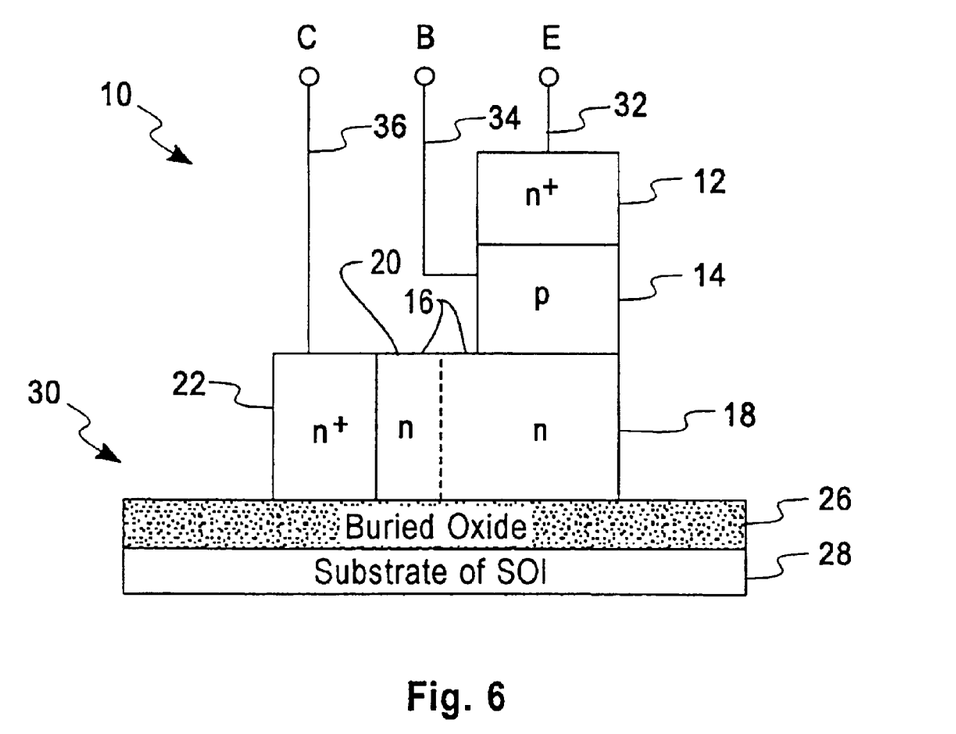
FIG. 6 is a cross section schematic view of one embodiment of the invention.

The basic structure of the fully-depleted-collector SOI npn bipolar transistor 10 is illustrated in FIG. 6. Bipolar transistor 10 has an emitter 12 of n+ type semiconductor, a base 14 of p type semiconductor and a collector 16 having a depleted n collector region 18 and a quasi-neutral n collector region 20. An n+ type semiconductor region 22 contiguous with quasi-neutral n collector region 20 provides a low impedance reachthrough for electrical connection to circuit wiring. As shown in FIG. 6, emitter 12 is over base 14. Base 14 is over collector region 18 and does not contact collector region 20. Collector region 20 is positioned between collector region 18 and n+ type semiconductor region or reachthrough 22. Collector regions 18 and 20 and n+ type semiconductor region 22 are positioned over buried oxide layer 26. Below buried oxide layer 26 is over substrate 28. Silicon-on-Insulator 30 comprises semiconductor regions 14, 18, 20 and 22, buried oxide 26 and substrate 28. Electrical contact to bipolar transistor 10 may be made via contact to leads 32, 34 and 36 which are coupled, respectively, to the emitter 12, base 14 and collector 16 via semiconductor region 22.

FIG. 6 shows that this is no quasi-neutral collector region 20 underneath the base region 14. The collector region 18 directly underneath base is fully depleted. There is only a space-charge region between the base region 14 and the buried oxide layer 26 of the SOT 30. There is a small quasi-neutral collector region 20 horizontally between the fully depleted collector region 18 (the space-charge region) and the collector reachthrough region 22. There is no need for an n+ type subcollector layer as used in the prior art. The n+ type reachthrough 22, the quasi-neutral collector region 20, and the fully depleted collector region 18 all lie on top of the buried oxide 26 of the SOT 30.

Figure 7:
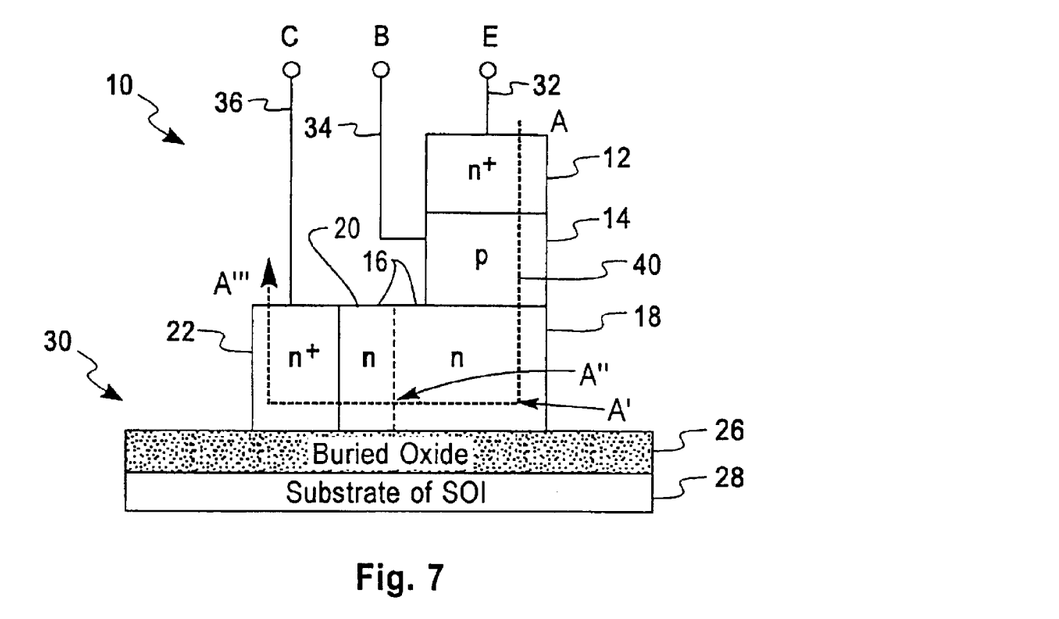
FIG. 7 is a cross section schematic view of the electron current path through the embodiment of FIG. 6.
Figure 8:
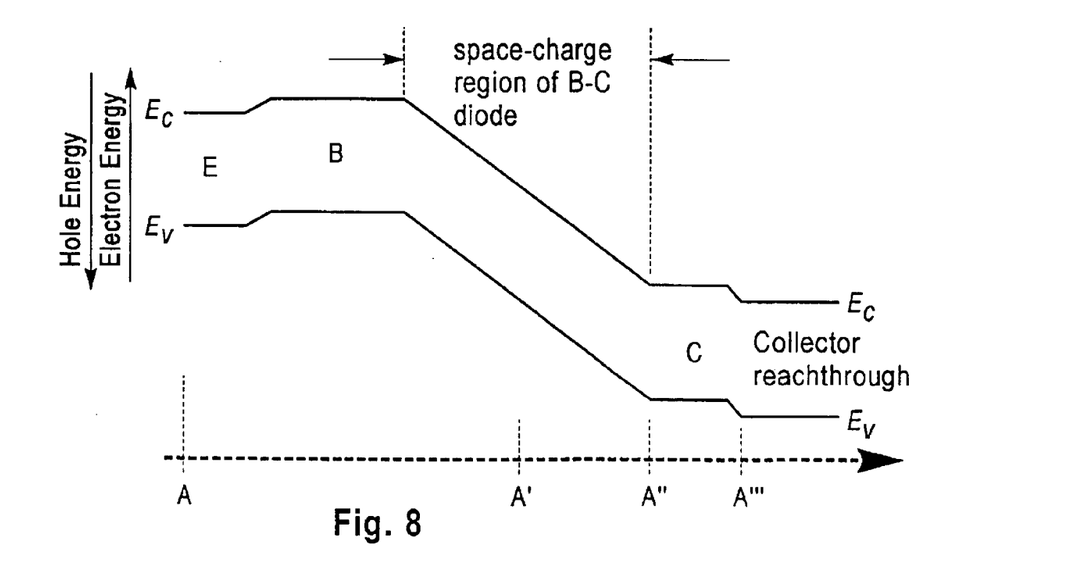
FIG. 8 shows an energy band diagram along the electron current path shown in FIG. 7.
Figure 9:
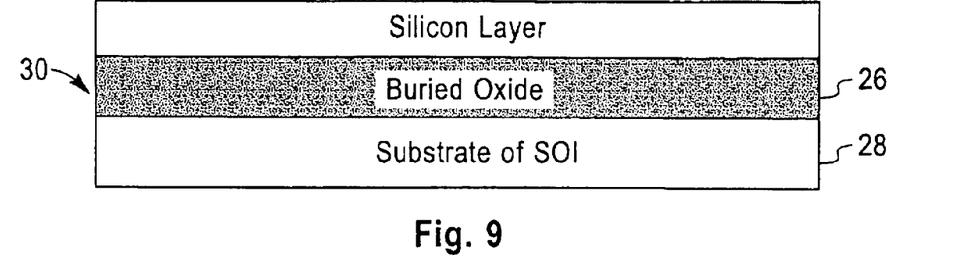
FIGS. 9–18 are cross section schematic views illustrating the steps for fabricating a fully-depleted-collector SOI vertical npn bipolar transistor having the base region formed in an epitaxially deposited silicon layer.

The electron current path for this fully-depleted-collector SOI bipolar transistor 10 is indicated in FIG. 7 by arrow 40. Electrons from the emitter 12 enter the space-charge region 18 of the collector 16 after traversing the base 14. Once inside the space-charge region 18, these electrons follow the electric field in the space-charge region and drift more or less laterally towards the quasi-neutral region 20 of collector 16. From there, electron current is carried by the n+ type reachthrough 22 to the semiconductor surface. Since the electrons traverse the space-charge region 18 more or less laterally, instead of vertically in a traditional vertical bipolar transistor as shown in FIG. 2, there is no need for an n+ type subcollector layer. The energy-band diagram along the electron path 40 is illustrated in FIG. 8. Position A indicates the emitter contact 32. Position A' indicates where the electrons approach the buried oxide 26 of the SOI 30. Position A" indicates where the electrons reach the quasi-neutral region 20 of collector 16.

Figure 1:
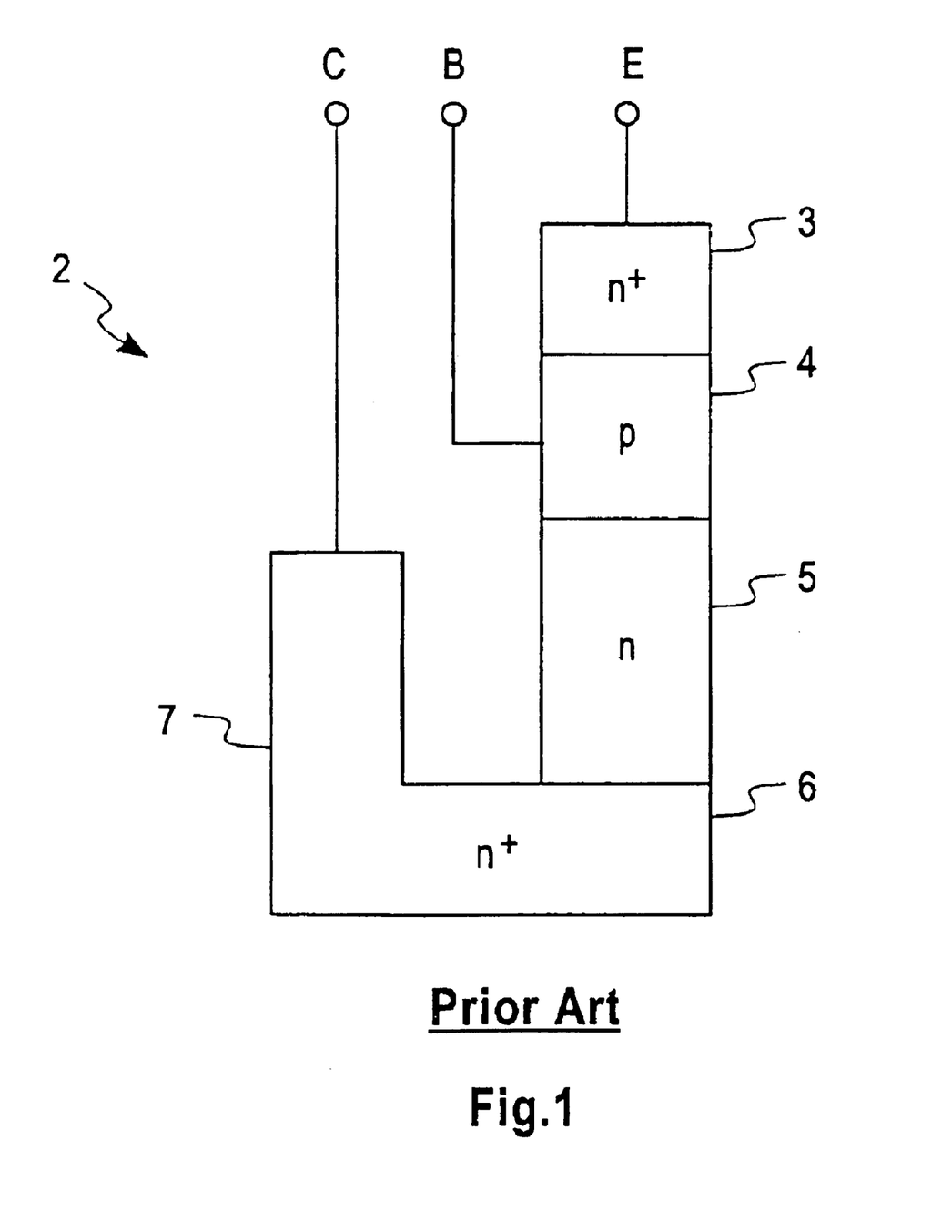
FIG. 1 is a cross section schematic view of a vertical bipolar transistor of the prior art.

For the traditional vertical bipolar transistor, such as the one shown in FIG. 1, 4, or 5, the base-collector junction capacitance is given by the usual base-collector diode space-charge layer capacitor. For the fully-depleted-collector SOI bipolar transistor 10, the base-collector junction capacitance is given by two capacitors in series. They are the vertical space-charge layer capacitor and the buried oxide capacitor. For two capacitors in series, the combined capacitance is determined primarily by the smaller of the two capacitors. Thus, the base-collector junction capacitance of the fully-depleted-collector SOI transistor is determined primarily by the buried oxide capacitor. This capacitance is much smaller than the base-collector junction capacitance of a traditional vertical bipolar transistor.

As an example, consider a vertical bipolar transistor with a collector doping concentration of $2\times10^{17}$ cm$^{-3}$ and a base-collector reverse bias of 3 V. The base-collector diode space-charge width is about 160 nm. This width is about the same as the thickness of the silicon layer of high-speed SOI CMOS devices. Thus the fully-depleted-collector bipolar transistor 10 is readily compatible with high-speed SOI CMOS for making high-speed SOI BiCMOS.

The fully-depleted-collector SOI bipolar transistor 10 can be implemented with the commonly used vertical bipolar structures and processes. Thus, it can be of the double-polysilicon self-aligned type, or double-polysilicon non-self-aligned type. The intrinsic base layer can be formed by epitaxial deposition of silicon or by ion implantation of the silicon layer over insulator 26 of SOI 30. With epitaxially deposited silicon for the base 14, germanium can also be added during deposition to form a SiGe-base bipolar transistor 10.

Figure 10:
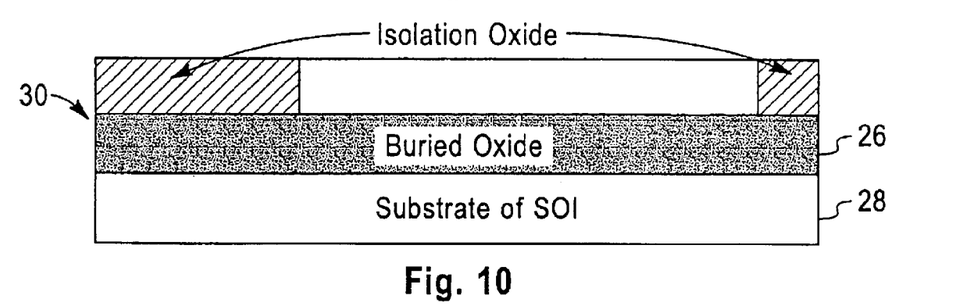
Figure 11:
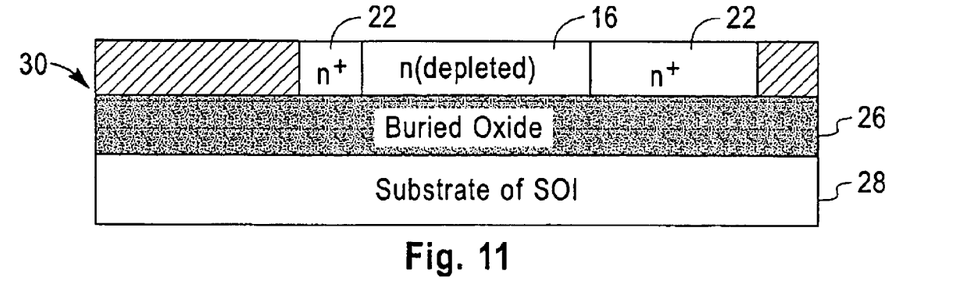
Figure 12:
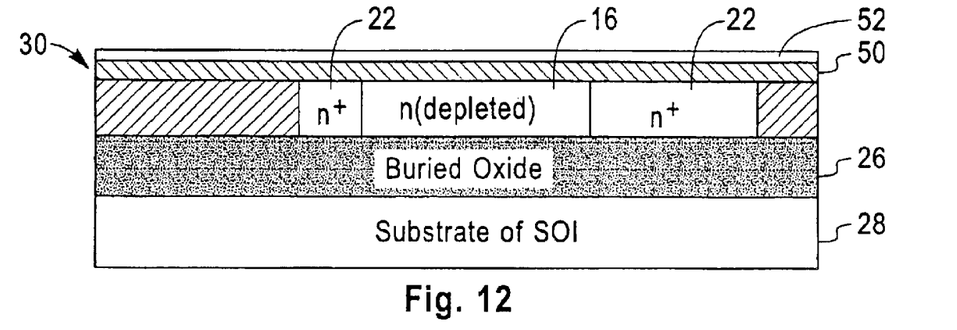
Figure 13:
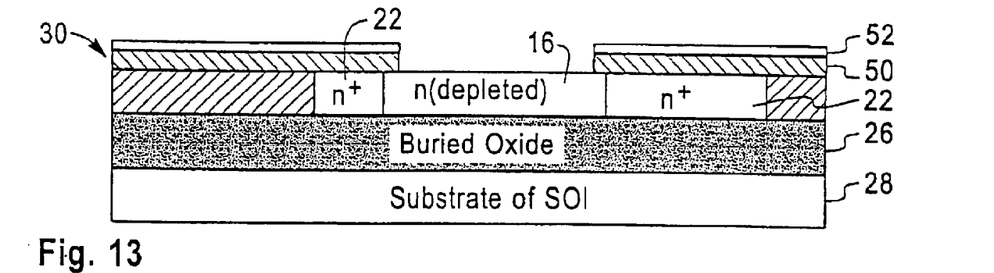
Figure 14:
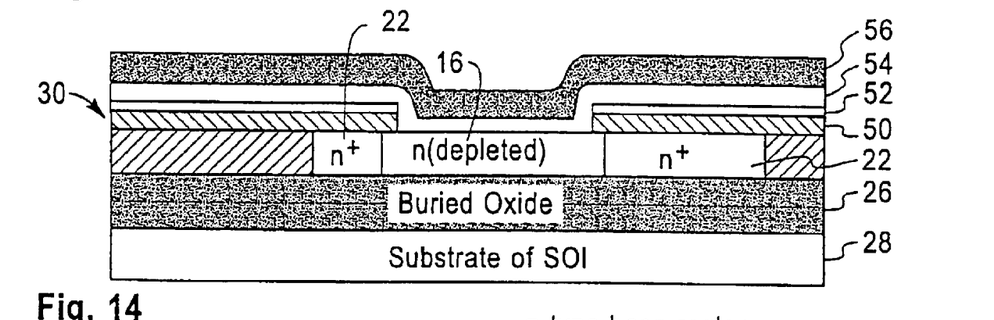
Figure 15:
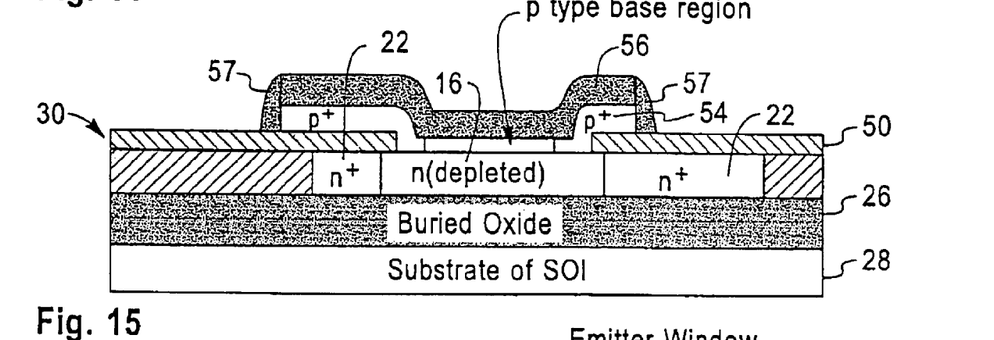
Figure 16:
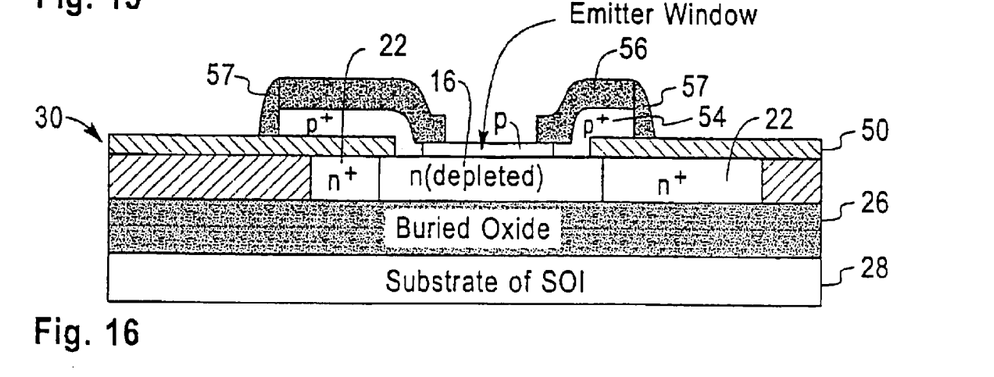
Figure 17:
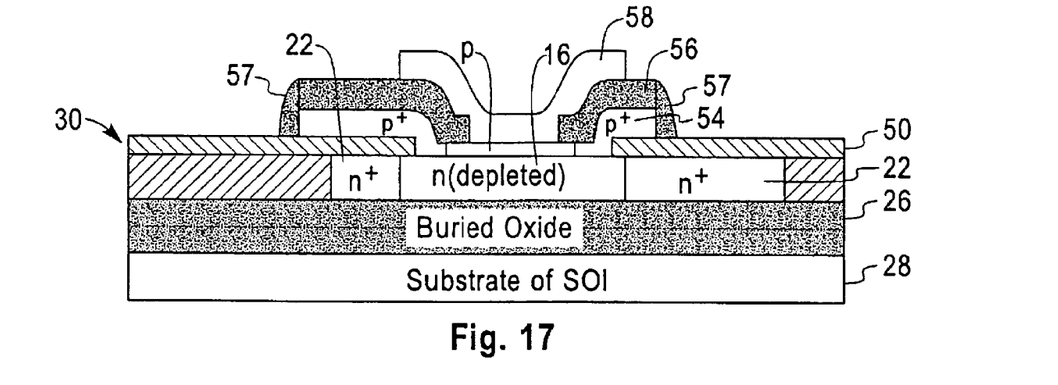
Figure 18:
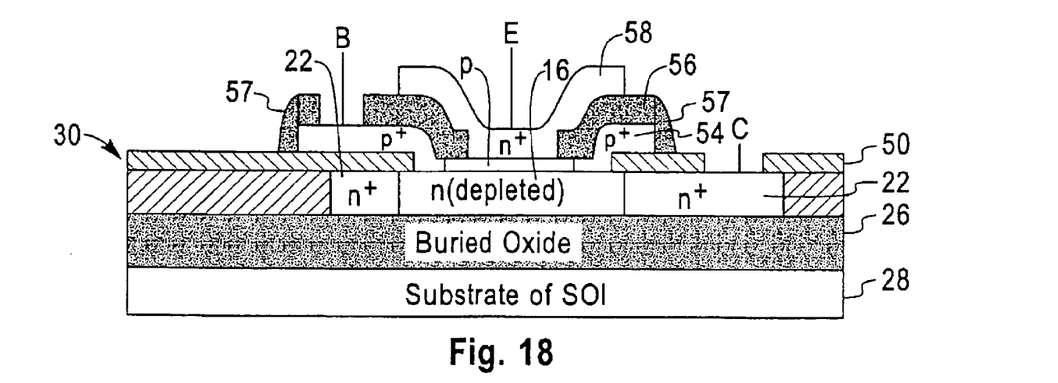
Figure 19:
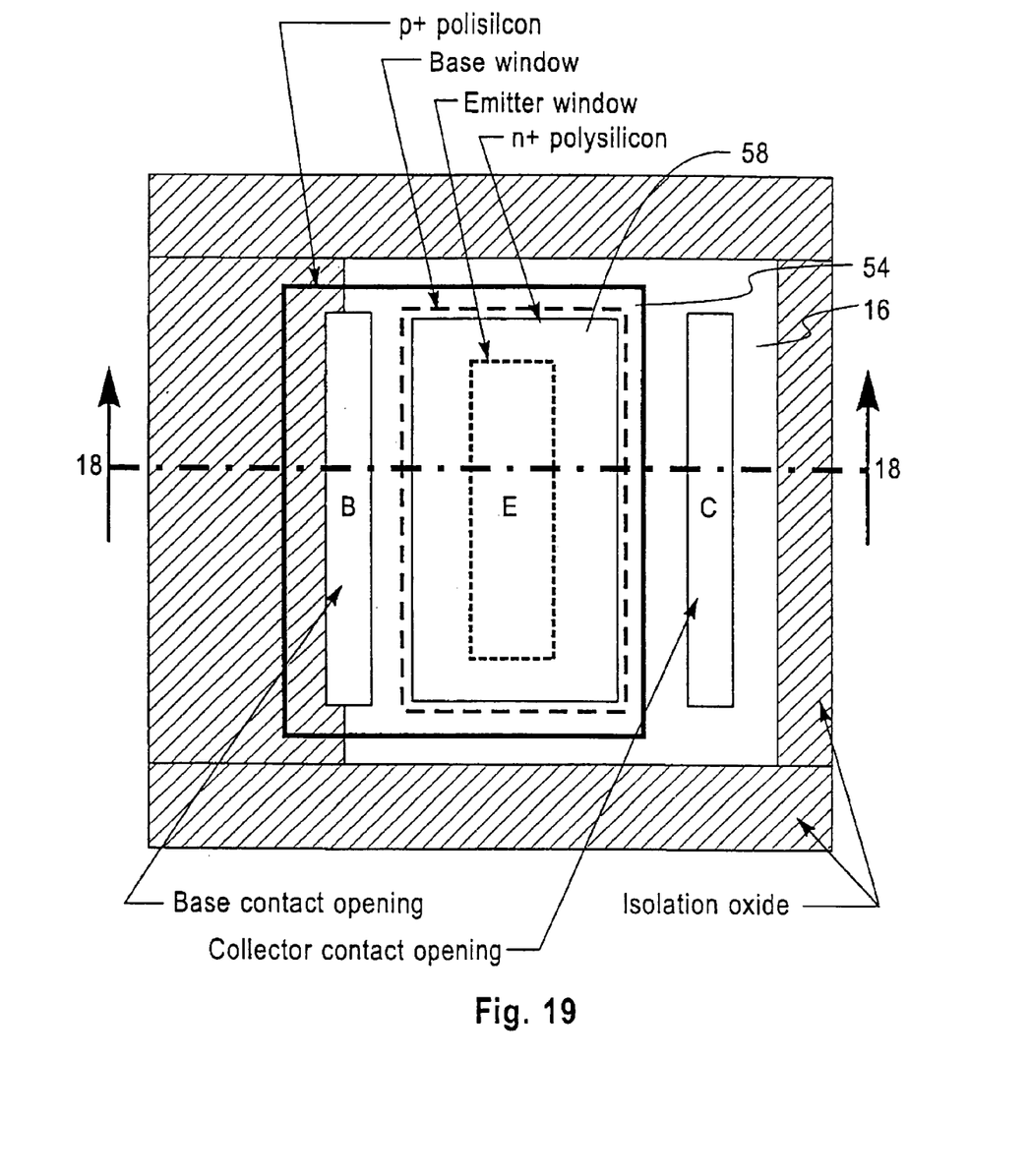
FIG. 19 is a top schematic view of the transistor shown in FIG. 18.
Figure 20:
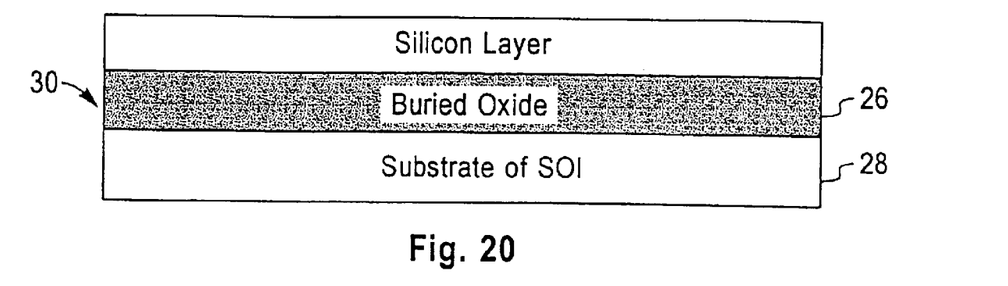
FIGS. 20–27 are cross section schematic views illustrating the steps for fabricating a double-polysilicon self-aligned vertical npn bipolar transistor.

A process for fabricating a fully-depleted-collector SOI bipolar transistor 10, using a double-polysilicon non-self-aligned structure and epitaxial deposition of silicon, or silicon-germanium (SiGe) alloy, for forming the intrinsic base is outlined in FIGS. 9 to 18. The starting SOI wafer 30 shown in FIG. 9, can be prepared by any one of the common SOI preparation processes. Isolation oxide can be formed by the usual masked oxidation of silicon, or by the usual shallow-trench isolation processes which involve etching silicon trenches and then filling the trenches with oxide followed by planarization using chemical-mechanical polishing. The resulting structure is illustrated in FIG. 10. A blanket implantation step is then made to dope the n-type collector region 16. The implantation step provides a concentration so that the n-type collector region 16 will be completely depleted when the transistor is used in circuit applications. For example, if the silicon layer thickness is 100 nm and the base-collector diode is reverse-biased at 3 V, full depletion of the collector region is assured if its average doping concentration is less than about $3\times10^{17}$ cm$^{-3}$. A masked implantation step is used to dope the reachthrough region 22, which is shown as surrounding the collector region 16, more heavily. This is illustrated in FIG. 11. An insulator layer 50, for example an oxide layer, is deposited or formed. A heavily p-type doped polysilicon layer 52, which will form part of the base contact polysilicon layer, is deposited. This is illustrated in FIG. 12. The base region window is etched open, as shown in FIG. 13. A layer of silicon 54 is then grown or deposited epitaxially over collector 16. Over the single-crystal base window region, the deposited silicon layer 54 is crystalline and forms the intrinsic base of the bipolar transistor, but over the polysilicon region 52, the deposited silicon layer 54 is polycrystalline and simply adds to the thickness of polysilicon layer 52. The intrinsic base is doped p-type. The doping can be done by boron implantation of the deposited layer of silicon 54, or by in situ doping of silicon layer 54 during deposition. If germanium is added to silicon layer 54 during deposition, the resulting transistor will be a SiGe-base bipolar transistor. A layer of insulator 56, for example an oxide layer, is then deposited. This is shown in FIG. 14. The base polysilicon layer 54 is patterned, followed by an oxide deposition and reactive-ion etching to form a sidewall oxide 57 on the vertical surface of the etched polysilicon 54, as shown in FIG. 15. The emitter window is etched open, as shown in FIG. 16. An n+ polysilicon emitter 58 is formed as shown in FIG. 17. Contact windows to the base and the collector are then etched open. The cross section view of a completed transistor is shown in FIG. 18. A top schematic view of the completed transistor is shown in FIG. 19.

Figure 21:
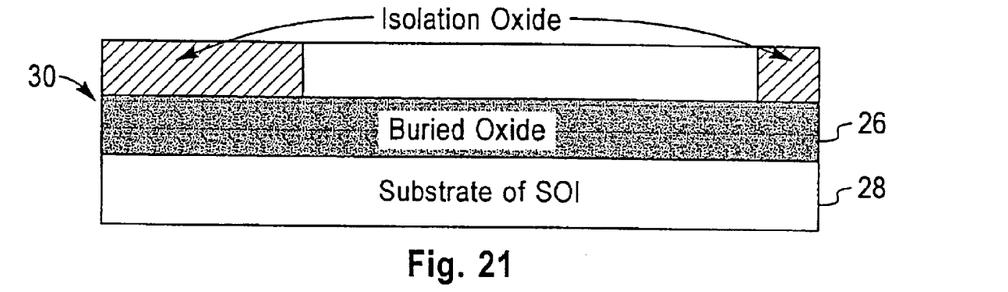
Figure 22:
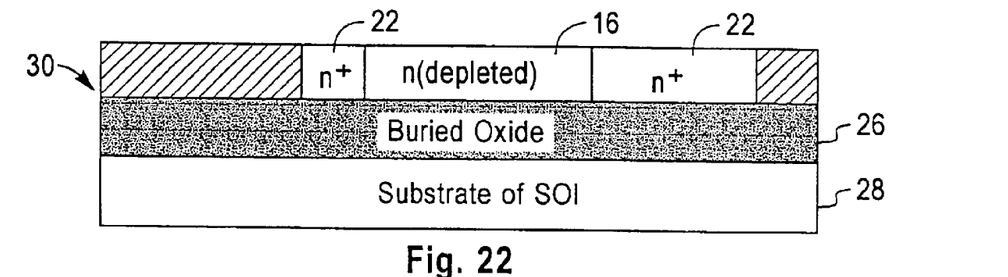
Figure 23:
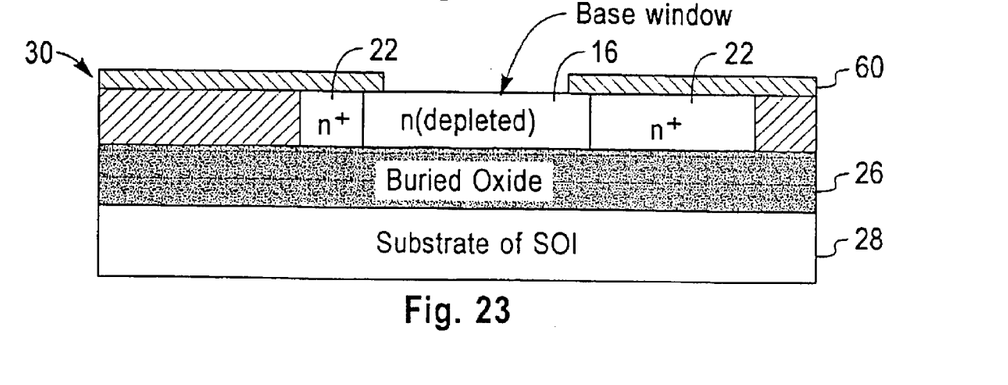
Figure 24:
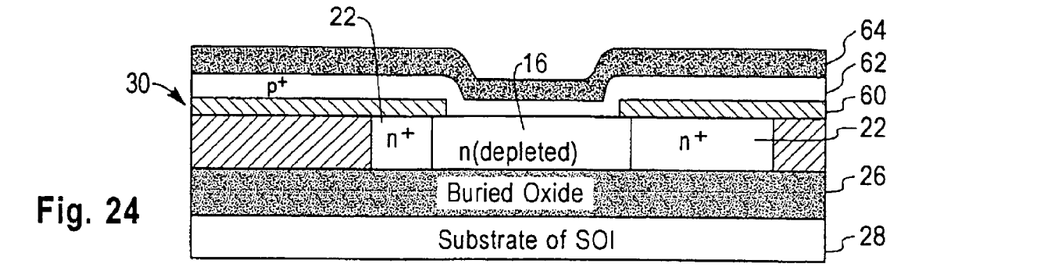
Figure 25:
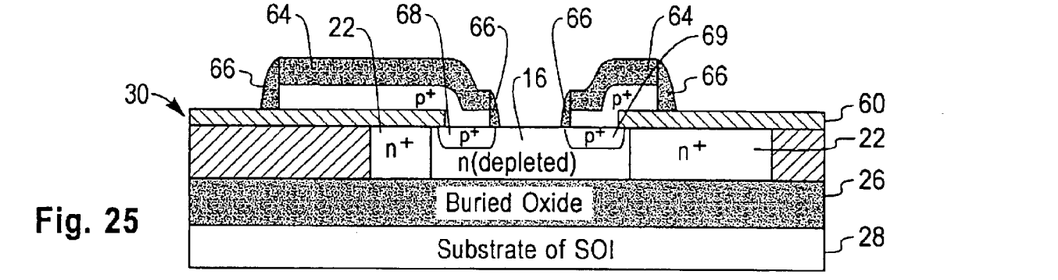
Figure 26:
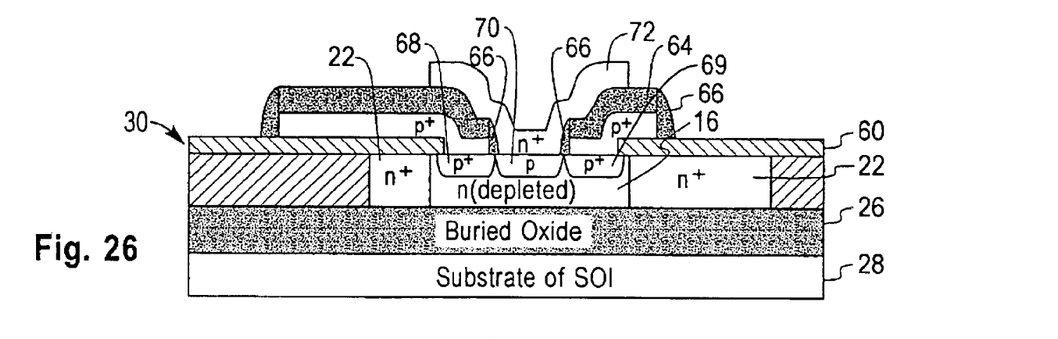
Figure 27:
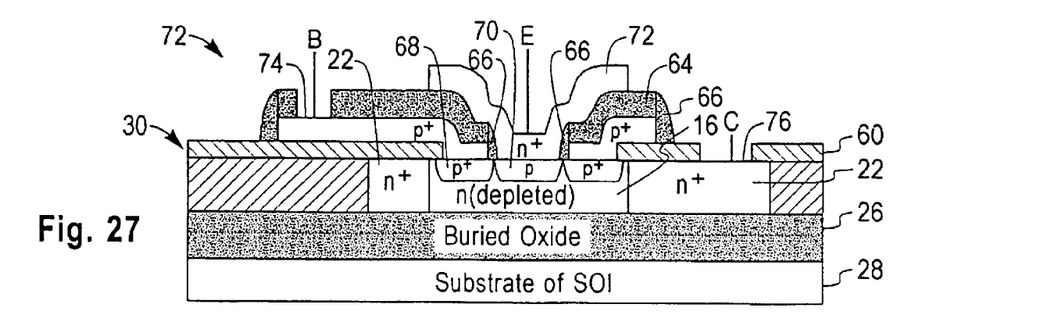

A process for fabricating a double-polysilicon self-aligned bipolar transistor, using ion-implantation for forming the intrinsic base region, is outlined in FIGS. 20 to 27. The starting SOI wafer 30 shown in FIG. 20, can be prepared by any of the common SOI preparation process. Isolation oxide can be formed by the usual masked oxidation of silicon process, or by the usual shallow-trench isolation processes which involve etching silicon trenches and then filling the trenches with oxide followed by planarization using chemical-mechanical polishing. This is illustrated in FIG. 21. A blanket implantation step is then made to dope the n-type collector region 16. The implantation step provides a concentration so that the n-type collector region 16 will be completed depleted when the transistor is used in circuit applications. A masked implantation step is used to dope more heavily the reachthrough region 22, which is shown as surrounding the collector region 16. This is illustrated in FIG. 22. An insulator layer, for example an oxide layer 60, is deposited or formed. The base window is etched open. This is illustrated in FIG. 23. A heavily p-type polysilicon layer 62 is deposited. Polysilicon layer 62 forms the base polysilicon contact layer. It can be doped in situ during deposition, or doped by ion implantation of an undoped polysilicon layer. An insulator layer 64, for example an oxide layer, is then deposited or formed. This is illustrated in FIG. 24. The base polysilicon layer 62 is patterned and a sidewall insulator layer 66 is formed on the vertical etched surface. A thermal annealing process is carried out to drive the p-type dopant from the polysilicon layer 62 into the single crystal region to form p+ regions 68 and 69. These p+ regions 68 and 69 are for connecting to the p-type intrinsic base region, to be formed later. This is illustrated in FIG. 25. The intrinsic base region 70 is formed by boron implantation. The n+ polysilicon emitter 72 is then formed. This is illustrated in FIG. 26. The base contact 74 and the collector contact 76 are then etched open. This completes formation of the double-polysilicon self-aligned implanted-base fully-depleted-collector SOI bipolar transistor 72, shown in FIG. 27.

It should be noted that fully-depleted-collector SOI pnp bipolar transistors can also be made by following the processes outlined in FIGS. 9 to 19 and in FIGS. 20 to 27 but using dopant impurities of the opposite type. Furthermore, both vertical npn and pnp bipolar transistors can be made on the same silicon layer of the SOI 30 for use in complementary bipolar circuits.

Figure 28:
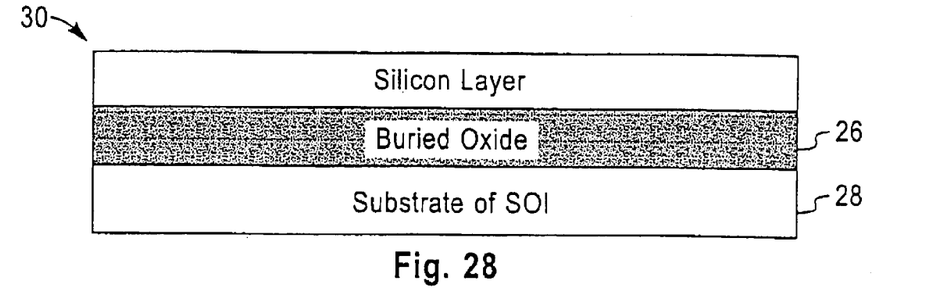
FIGS. 28–39 are cross section schematic views illustrating the steps for fabricating a vertical npn bipolar transistor structure shown in FIG. 18 and CMOS devices to provide SOI BiCMOS.
Figure 29:
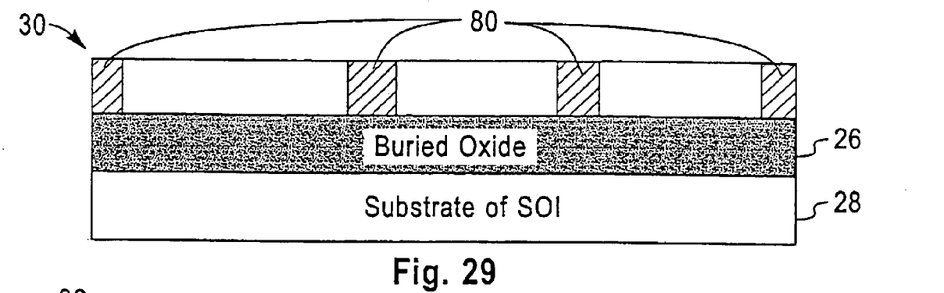
Figure 30:
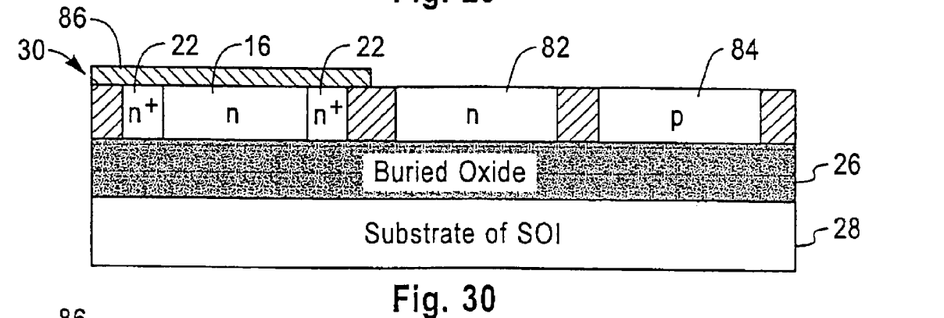
Figure 31:
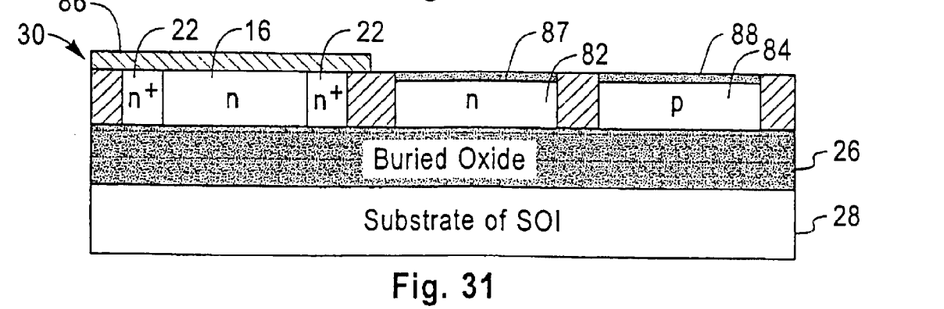
Figure 32:
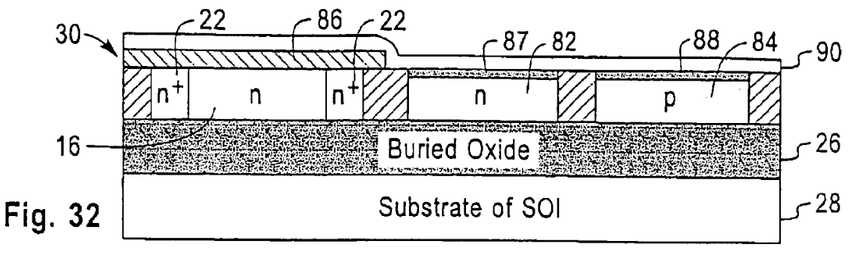
Figure 33:
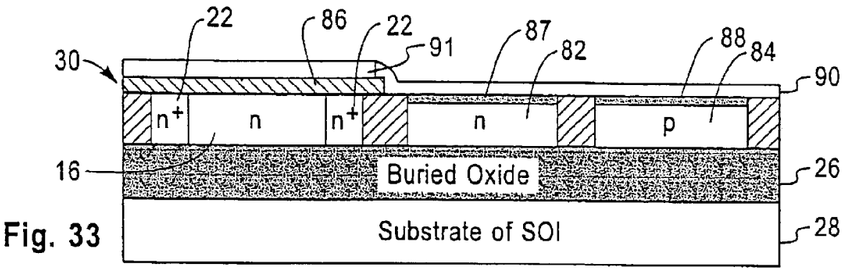
Figure 34:
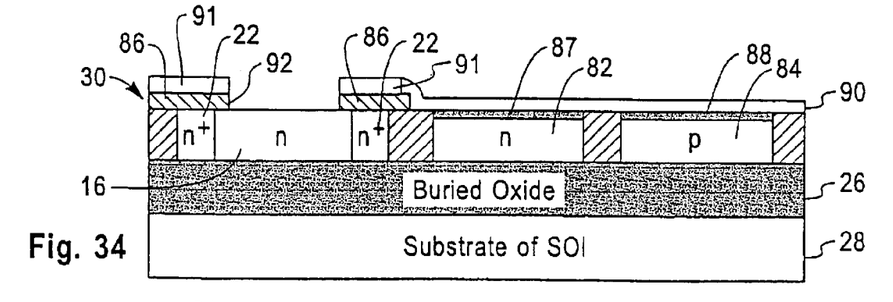
Figure 35:
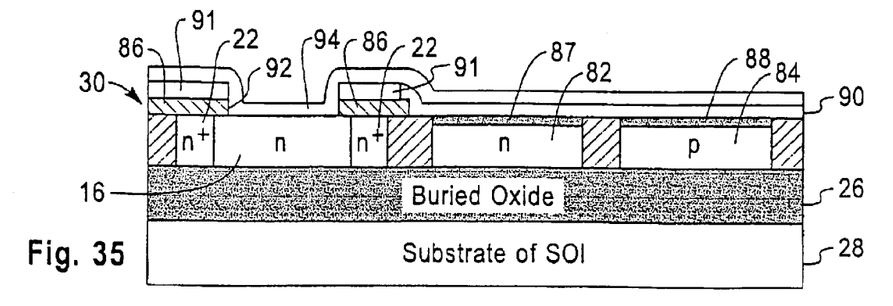
Figure 36:
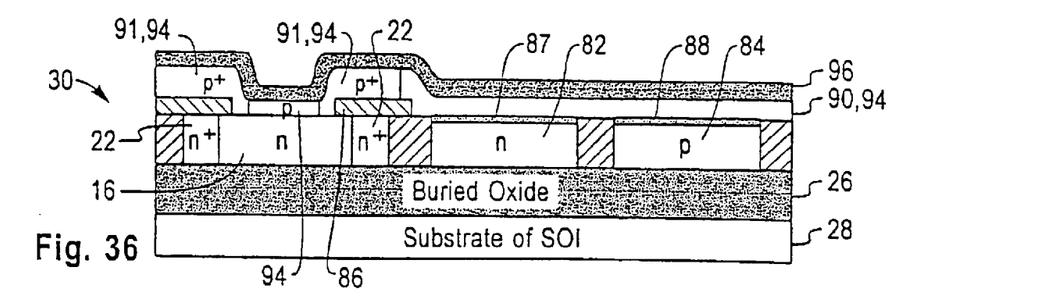
Figure 37:
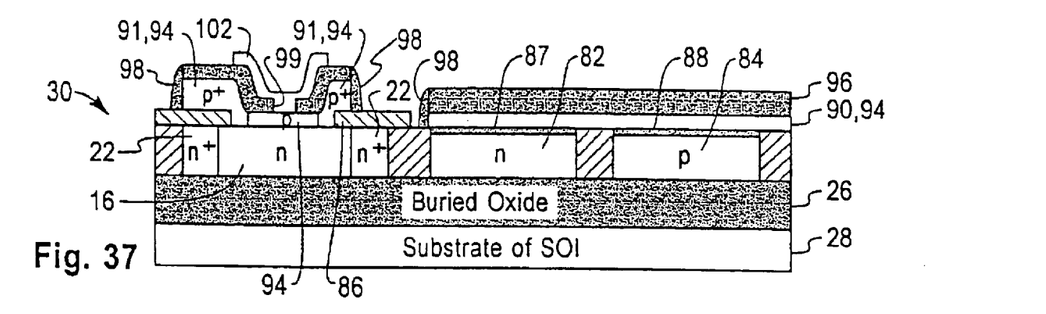
Figure 38:
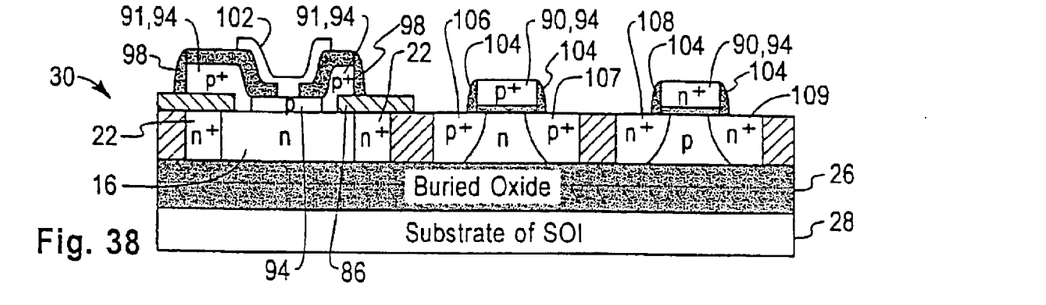
Figure 39:
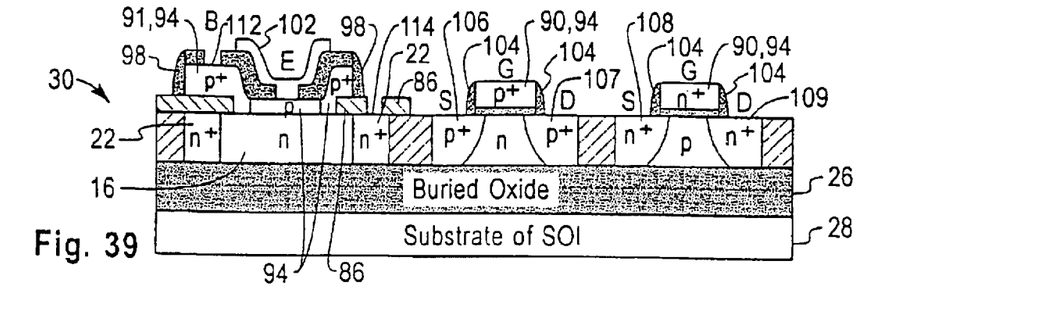

Any of the fully-depleted-collector SOI bipolar transistors can be integrated with SOI CMOS devices to form SOI BiCMOS. This is due to the fact that the silicon layer thickness for fully-depleted-collector SOI bipolar transistors can be the same as the silicon thickness for high-speed SOI CMOS devices. For simplicity of illustration, only the process for integrating a vertical npn bipolar transistor structure shown in FIGS. 18 and 19 and CMOS devices is outlined here, in FIGS. 28 to 39. The starting SOI wafer 30, shown in FIG. 28, can be prepared by any one of the common SOI preparation processes. Isolation oxide 80 can be formed by the usual masked oxidation of silicon, or by the usual shallow-trench isolation process which involves etching silicon trenches and then filling the trenches with oxide 80 followed by planarization using chemical-mechanical polishing. This is illustrated in FIG. 29. The depleted n-type collector region 16 is formed by masked ion implantation. The n+ type reachthrough regions 22 of the bipolar transistor are formed by masked ion implantation. The regions 82 and 84 for the n-channel MOSFET and the p-channel MOSFET, respectively, are also doped by masked ion implantation. An insulator layer 86, for example an oxide layer, is formed and patterned to insulate the bipolar transistor region. This is illustrated in FIG. 30. The gate insulators 87 and 88 for the CMOS devices are then formed, as shown in FIG. 31. A layer 90 of undoped polysilicon is deposited, as shown in FIG. 32. This polysilicon layer 90 serves to protect the gate insulators 87 and 88 while steps for forming the bipolar transistor are carried out. The polysilicon layer 90 is doped heavily p-type where it is used as the base polysilicon contact layer 91. This is illustrated in FIG. 33. The base window 92 is etched open, as shown in FIG. 34 A silicon layer 94 is deposited epitaxially, forming single-crystalline silicon over the silicon in the base window 92, and polycrystalline silicon over the polysilicon layer 90 and 91. The single-crystalline part of this deposited silicon layer 94 forms the base layer of the bipolar transistor. The polycrystalline part simply adds to the thickness of the polysilicon layer 90. This thickened polysilicon layer 90 and 94 forms the base polysilicon contact layer for the bipolar transistor and the gate polysilicon layer for the CMOS devices. This is illustrated in FIG. 35. An insulator layer 96, for example an oxide layer, is deposited, as shown in FIG. 36. The insulator layer 96 and polysilicon layers 90 and 94 are then patterned by reactive-ion etching to form the polysilicon base contact structure. An oxide layer is deposited and then etched to form an oxide sidewall 98 to insulate the vertical polysilicon surfaces 91, 94 and 90, 94. The emitter window 99 is then etched open, and an n+ doped polysilicon layer 102 is deposited and patterned to form the polysilicon emitter. This is illustrated in FIG. 37. The gate polysilicon 90, 94 for the CMOS devices are then patterned, and sidewall insulator 104 is formed on the vertical surface of the gate polysilicon. The gate polysilicon 90, 94, and the source regions 106, 108 and drain regions 107, 109, are then doped by ion implantation. This is illustrated in FIG. 38. Contacts 112 and 114 to the base and the collector respectively of the bipolar transistor are then etched open, as illustrated in FIG. 39. A top view of the bipolar transistor is similar to FIG. 19. This completes formation of the BiCMOS devices.

It should be noted that in the drawing like elements or components are referred to by like and corresponding reference numerals.

While there has been described and illustrated a bipolar transistor structure having a fully depleted collector region on an insulator and without the need for an n+ subcollector, it will be apparent to those skilled in the art that modifications and variations are possible without deviating from the broad scope of the invention which shall be limited solely by the scope of the claims appended hereto.

Having thus described my invention, what I claim as new and desire to secure by Letters Patent is:

1. A bipolar transistor comprising:

a substrate, an insulating layer over said substrate, a first single crystal semiconductor layer positioned over said insulating layer having a lightly doped region of a first type and at least one contiguous heavily doped region of said first type, said lightly doped region and said at least one contiguous heavily doped region functioning as a collector, wherein said lightly doped region is directly underneath a base, a second patterned semiconductor layer of a second type formed over said lightly doped region of said first semiconductor layer to function as the base, and a third patterned semiconductor layer of said first type position over said second semiconductor layer to function as an emitter, said lightly doped region of said first type having a dopant concentration to fully deplete of mobile charge through said first semiconductor layer to said insulating layer, wherein said doping concentration of said lightly doped region has a lowest doping concentration of said collector.

2. A bipolar transistor of claim 1 wherein said first single crystal semiconductor layer has a thickness in the range from 30 to 1000 nanometers.

3. A bipolar transistor of claim 1 wherein said second patterned semiconductor layer is a silicon-germanium alloy.

* * * * *